(12) United States Patent
Whang et al.

(10) Patent No.: US 9,515,074 B2
(45) Date of Patent: Dec. 6, 2016

(54) 3-D NON-VOLATILE MEMORY DEVICE AND METHOD OF MANUFACTURING THE SAME

(71) Applicant: SK hynix Inc., Gyeonggi-do (KR)

(72) Inventors: Sung Jin Whang, Seoul (KR); Ki Hong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/795,766

(22) Filed: Jul. 9, 2015

(65) Prior Publication Data

US 2015/0311209 A1    Oct. 29, 2015

Related U.S. Application Data

(62) Division of application No. 13/315,147, filed on Dec. 8, 2011, now Pat. No. 9,112,044.

(30) Foreign Application Priority Data

Dec. 14, 2010  (KR) ........................ 10-2010-0127612

(51) Int. Cl.
| | |
|---|---|
| *H01L 29/788* | (2006.01) |
| *H01L 27/105* | (2006.01) |
| *H01L 21/764* | (2006.01) |
| *H01L 27/115* | (2006.01) |
| *H01L 29/792* | (2006.01) |
| *H01L 29/423* | (2006.01) |
| *H01L 29/66* | (2006.01) |
| *H01L 29/786* | (2006.01) |

(52) U.S. Cl.
CPC ......... *H01L 27/1052* (2013.01); *H01L 21/764* (2013.01); *H01L 27/11556* (2013.01); *H01L 27/11568* (2013.01); *H01L 27/11578* (2013.01); *H01L 27/11582* (2013.01); *H01L 29/4234* (2013.01); *H01L 29/66833* (2013.01); *H01L 29/7889* (2013.01); *H01L 29/7926* (2013.01); *H01L 29/78642* (2013.01)

(58) Field of Classification Search
CPC .................................................. H01L 27/1052
USPC ........................................................ 257/315
See application file for complete search history.

(56) References Cited

U.S. PATENT DOCUMENTS

| | | | | |
|---|---|---|---|---|
| 7,868,376 | B2 * | 1/2011 | Aoyama | H01L 21/28247 257/324 |
| 2009/0242967 | A1 * | 10/2009 | Katsumata | H01L 21/764 257/324 |

* cited by examiner

*Primary Examiner* — Ajay K Arora
(74) *Attorney, Agent, or Firm* — IP & T Group LLP

(57) ABSTRACT

A three-dimensional (3-D) non-volatile memory device includes a plurality of word line structures extended in parallel and including a plurality of interlayer dielectric layers and a plurality of word lines that are alternately stacked over a substrate, a plurality of channels protruding from the substrate configured to penetrate the plurality of interlayer dielectric layers and the plurality of word lines, and an air gap formed between the plurality of word line structures.

13 Claims, 10 Drawing Sheets

3-D NON-VOLATILE MEMORY DEVICE AND METHOD OF MANUFACTURING THE SAME

CROSS-REFERENCE TO RELATED APPLICATION

This application is a division of U.S. patent application Ser. No. 13/315,147 filed on Dec. 8, 2011, which claims priority to Korean patent application number 10-2010-0127612 filed on Dec. 14, 2010. The entire disclosure of each of the foregoing application is incorporated by reference herein.

BACKGROUND

Exemplary embodiments relate to a semiconductor device and a method of manufacturing the same and, more particularly, to a three-dimensional (3-D) non-volatile memory device and a method of manufacturing the same.

A non-volatile memory device retains data although power is off. A 3-D non-volatile memory device may have a higher data capacity and a higher integration degree than a 2-D non-volatile memory device.

The structure of a conventional 3-D non-volatile memory device and features thereof are described below.

FIG. 1A is a cross-sectional view showing the structure of an exemplary 3-D non-volatile memory device according to the conventional technology.

As shown in FIG. 1A, the 3-D non-volatile memory device according to the conventional technology includes a plurality of memory cells MC stacked along channels CH protruding from a substrate 10. The plurality of memory cells MC is coupled in series between a lower select transistor LST and an upper select transistor UST to form one string. Furthermore, a bit line BL is coupled to the channels CH.

In FIG. 1A, reference numerals '11' and '16' denote a gate insulation layer, reference numeral '13' denotes a lower select line, reference numeral '15' denotes a word line, and reference numeral '17' denotes an upper select line. Furthermore, reference numeral '12' denotes an interlayer dielectric layer, which is formed of an oxide layer.

The structure of FIG. 1A has an RC delay because the word lines 15 are extended in a specific direction. In order to prevent the RC delay, a resistance of the word lines 15 may be reduced by siliciding the edge regions of the word lines 15.

If the number of stacked memory cells MC is increased in order to increase the degree of integration in the memory device, the total thickness of the memory stack is increased. By increasing the thickness of the memory device, an etch process may be more difficult. Furthermore, a capacitance between conductive lines varies, and a gap-fill margin is reduced, and thus gap-filling characteristics vary for the conductive lines. Furthermore, the electrical properties of the memory device are deteriorated because of disturbances generated between the word lines. A method of reducing the thickness of the interlayer dielectric layer 12 that reduces the total thickness of a memory stack may address some of the above described features of the memory devices.

FIG. 1B is an enlarged cross-sectional view of the word line regions of the 3-D non-volatile memory device according to the conventional technology. FIG. 1B is an enlarged cross-sectional view of a region A in FIG. 1A.

If the edge regions 15A of the word lines 15 are silicided as shown in FIG. 1B, RC delay may be reduced to some extent because the resistance of the edge regions 15A is lowered. If the edge regions 15A are silicided, current mostly flows through the edge regions 15A of the word lines. However, RC delay may still remain because the capacitance between the neighboring word lines 15 or 15A (as denoted by the capacitor symbol illustrated in FIG. 1B) is great because the interlayer dielectric layer 12 exists between the neighboring word lines 15 and 15A.

More specifically, if the thickness of the interlayer dielectric layer 12 is reduced so as to reduce the total thickness of the memory stack, RC delay increases because the capacitance between the neighboring word lines 15 or 15A is further increased.

BRIEF SUMMARY

Exemplary embodiments relate to a 3-D non-volatile memory device suitable for decreasing RC delay and a method of manufacturing the same.

A three-dimensional (3-D) non-volatile memory device according to an aspect of the present disclosure includes a plurality of word line structures extended in parallel including a plurality of interlayer dielectric layers and a plurality of word lines that are alternately stacked over a substrate, a plurality of channels protruding from the substrate configured to penetrate the plurality of interlayer dielectric layers and the plurality of word lines, and an air gap formed between the plurality of word line structures.

A three-dimensional (3-D) non-volatile memory device according to another aspect of the present disclosure includes a plurality of channels protruding from a lower structure, a plurality of word lines stacked along each of the channels, and an air gap formed between the word lines.

A method of manufacturing a three-dimensional (3-D) non-volatile memory device according to yet another aspect of the present disclosure includes forming a plurality of memory cells stacked along channels protruded from a substrate, wherein the channels penetrate a plurality of first material layers and a plurality of second material layers that are alternately stacked over the substrate, forming a plurality of word line structures extended in parallel, forming a slit between the plurality of word line structures by etching the plurality of first material layers and the plurality of second material layers between neighboring channels, and forming an air gap between the plurality of word line structures by forming an insulating layer to cover a top of the slit.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
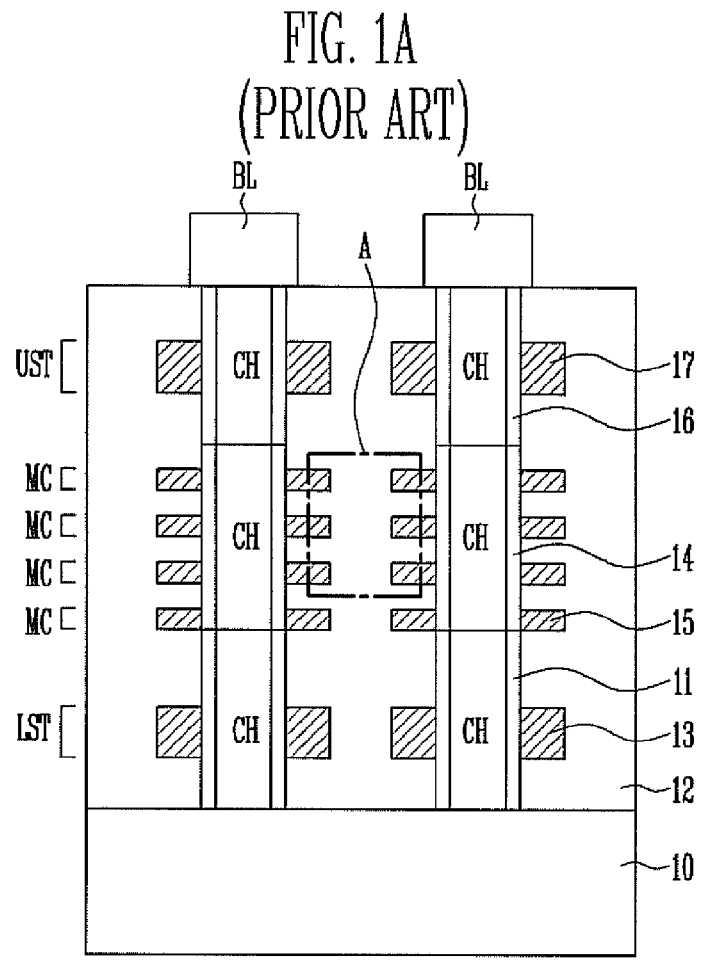
FIG. 1A is a cross-sectional view illustrating the structure of a known 3-D non-volatile memory device.
Figure 1B:
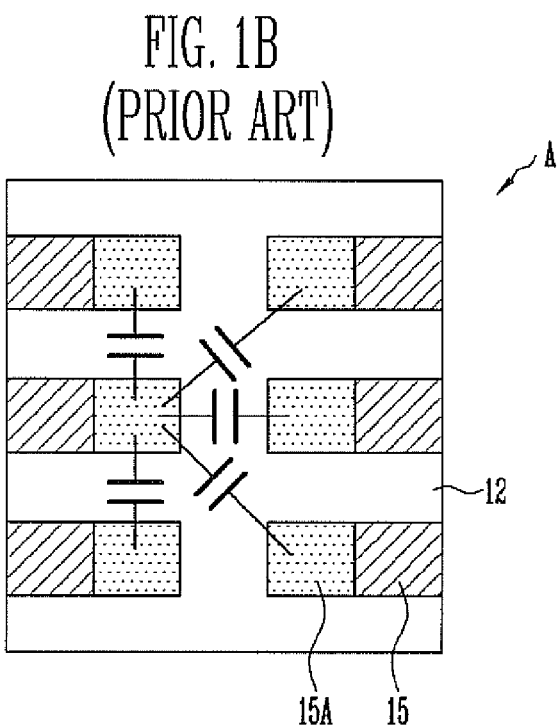
FIG. 1B is an enlarged cross-sectional view of the word line regions of the known 3-D non-volatile memory device.
Figure 2:
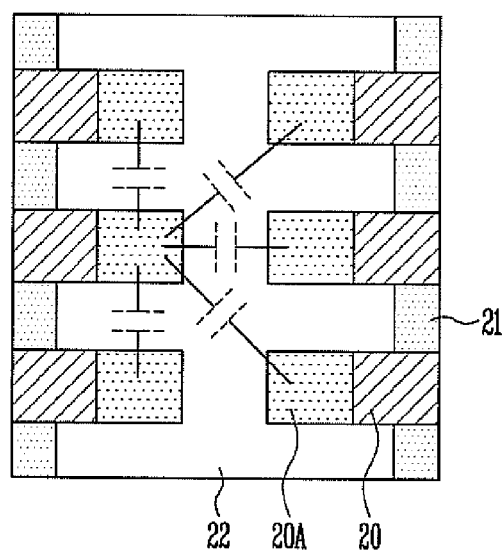
FIG. 2 is an enlarged cross-sectional view of the word line regions of a 3-D non-volatile memory device according to an embodiment of this disclosure.

FIG. 2 is an enlarged cross-sectional view of the word line regions of a 3-D non-volatile memory device according to an embodiment of this disclosure.

As shown in FIG. 2, the 3-D non-volatile memory device according to the embodiment of this disclosure includes an air gap 22 between neighboring word lines 20, 20A. The word line edge region 20A may be silicided. Furthermore, the air gap 22 may be formed between neighboring word lines of the word lines 20, 20A or may be formed between some of the word lines 20, 20A.

The structure including an air gap 22 may reduce a capacitance to ⅓ or less of the capacitance of the conventional technology because the air gap is made of air, which has a lower dielectric constant than an interlayer dielectric layer. Accordingly, the capacitance between the neighboring word lines 20, 20A can be reduced and thus RC delay can be decreased. Furthermore, since the thickness of the interlayer dielectric layer 21 may be reduced without increasing RC delay, the total thickness of a memory stack can be reduced, an etch process is less difficult, the manufacturing process can be simplified, and the manufacturing costs can be reduced. In addition, disturbances between the word lines 20, 20A can be reduced.

Various methods of manufacturing the 3-D non-volatile memory device using the air gap according to exemplary embodiments of this disclosure are described below with reference to the accompanying drawings.

FIGS. 3A to 3D are cross-sectional views illustrating a method of manufacturing the 3-D non-volatile memory device according to a first embodiment of this disclosure. For illustration purposes, select transistors are not shown, and the method of manufacturing the select transistors is omitted.

Figure 3A:
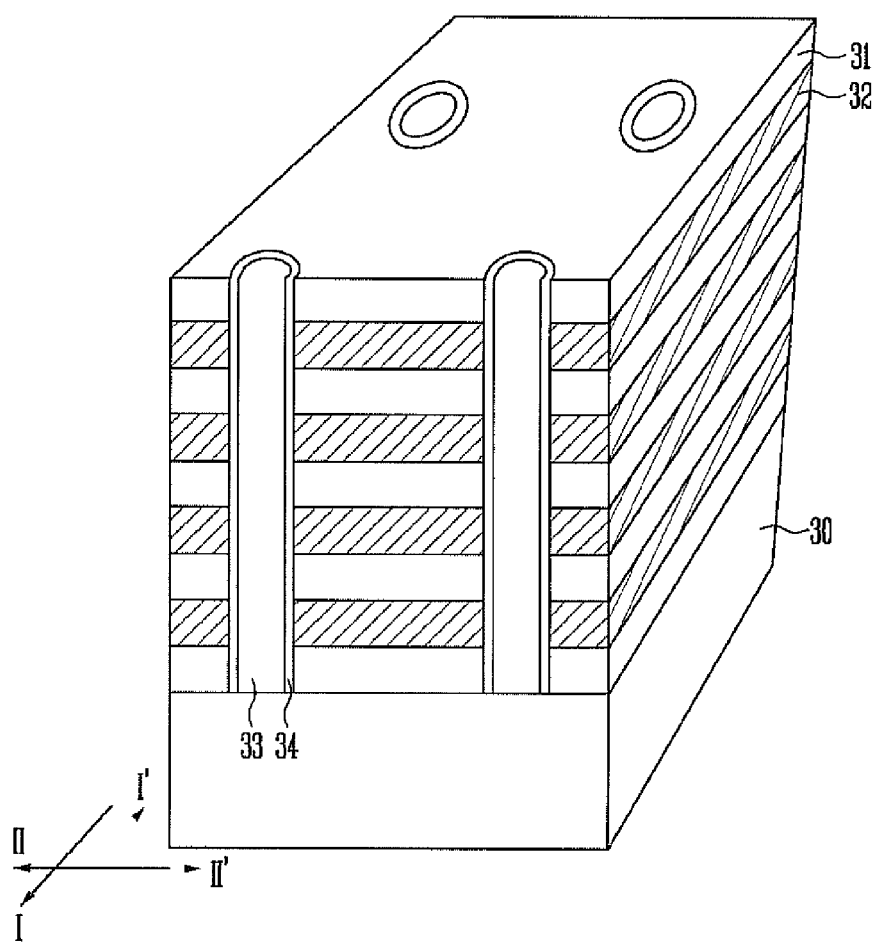
FIGS. 3A to 3D are cross-sectional views illustrating a method of manufacturing the 3-D non-volatile memory device according to a first embodiment of this disclosure.

As shown in FIG. 3A, a plurality of first material layers and a plurality of second material layers are alternately formed over a substrate 30.

The first material layers and the second material layers form a plurality of word lines. Each of the first material layers is used to form an interlayer dielectric layer for separating the word lines from each other, and the second material layers are used to form the word lines through a subsequent process.

The first material layer and the second material layer are made of materials having a large etch selectivity. For example, the first material layer may be formed of an interlayer dielectric layer or a sacrificial layer, and the second material layer may be formed of a conductive layer or a sacrificial layer.

Hereinafter, in the first embodiment, the first material layer is an interlayer dielectric layer 31 and the second material layer is a conductive layer 32.

The interlayer dielectric layers 31 and the conductive layers 32 are alternately formed and then etched to form trenches for channels 33. A charge blocking layer, a charge trap layer, and a tunnel insulating layer 34 are formed on the inner walls of the trenches. After a charge blocking layer, a charge trap layer, and a tunnel insulating layer 34 are formed, channels 33 are formed. A plurality of memory cells MC are stacked along the channels 33. The channels 33 protrude from the substrate 30 and are formed to penetrate the plurality of interlayer dielectric layers 31 and the plurality of conductive layers 32.

Here, the plurality of channels 33 are formed at specific intervals in a first direction I-I' and a second direction II-II' crossing the first direction. Furthermore, in FIG. 3A, although the interlayer dielectric layer 31 and the conductive layer 32 are shown to have the same thickness, the interlayer dielectric layer 31 may be thinner than the conductive layer 32.

Figure 3B:
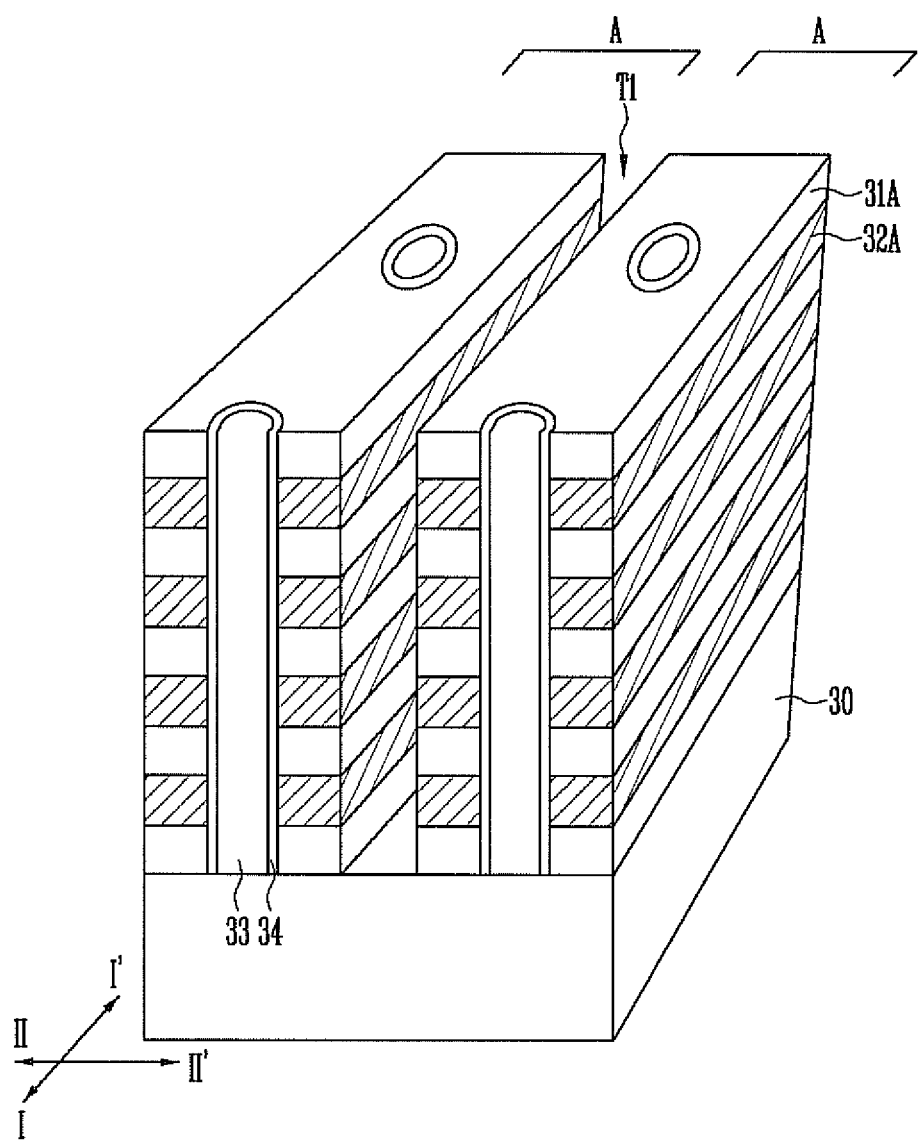

Referring to FIG. 3B, a plurality of word line structures A are formed in parallel, extending in the first direction, and a slit T1 between the plurality of word line structures A is formed by etching the plurality of interlayer dielectric layers 31 and the plurality of conductive layers 32 until the substrate 30 is exposed between neighboring channels 33. Each of the word line structures A has a structure where the plurality of interlayer dielectric layers 31A and the plurality of word lines 32A are alternately stacked.

The word line structure A has a structure in which the plurality of interlayer dielectric layers 31 and the plurality of conductive layers 32 are alternately stacked. The word line structure A includes the plurality of memory cells MC stacked along the channel 33. In FIG. 3B, each of the word line structures A has been illustrated to include one channel column, but each of the word line structures A may include two or more channel columns.

Figure 3C:
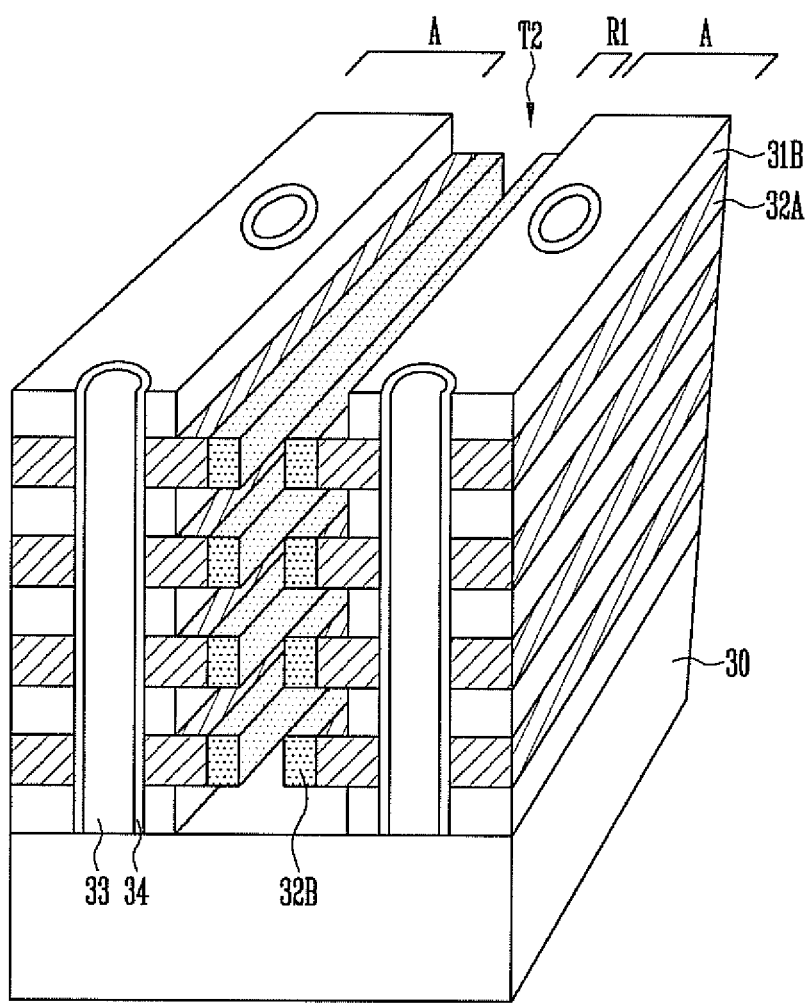

As shown in FIG. 3C, the edge regions 32B of the plurality of word lines 32A exposed by the slit T1 are silicided. For example, a metal layer is formed within the slit T1, the edge regions 32B of the word lines 32A may be silicided by an annealing process, and the remaining metal layer is removed.

Furthermore, recess regions R1 are formed by recessing the plurality of interlayer dielectric layers 31A. The recess regions R1 are formed by etching the interlayer dielectric layers 31A to a specific thickness on the side of the word line structures A where the slit T1 was formed. The slit T1 is extended into the recess region R1.

Here, the interlayer dielectric layers 31A may be recessed to remove the portion of the interlayer dielectric layers 31A surrounding at least the edge regions 32B of the silicided word lines. For example, the interlayer dielectric layers 31A may be recessed to the specific thickness using a remote plasma process using $NF_3$ or $SF_6$ or a wet etch process using diluted HF or an BOE (Buffered Oxide Etchant).

In the first embodiment, the interlayer dielectric layers 31A are recessed after the silicidation process is performed, but the silicidation process may be performed after the interlayer dielectric layers 31A are recessed.

In FIG. 3C, the recessed interlayer dielectric layers are assigned reference numeral '31B', and the slit extended by the recess regions is assigned reference numeral 'T2'.

Figure 3D:
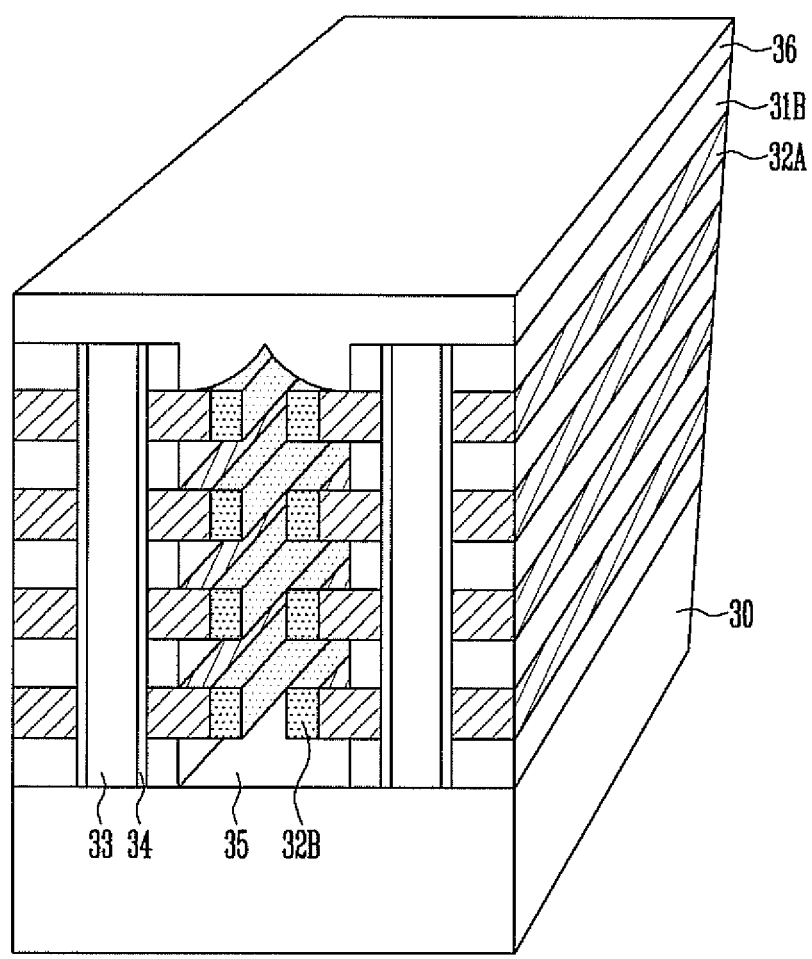

As shown in FIG. 3D, an insulating layer 36 is formed over the uppermost interlayer dielectric layer 31B and covering the top of the extended slit T2. An air gap 35 is formed between the plurality of word line structures A and covered by the insulating layer 36. The air gap 35 is enclosed by the plurality of interlayer dielectric layers 31A and the plurality of word lines 32A and the silicided word line edge regions 32B.

The insulating layer 36 may be formed using a Plasma Enhanced Chemical Vapor Deposition (PECVD) method.

Figure 4:
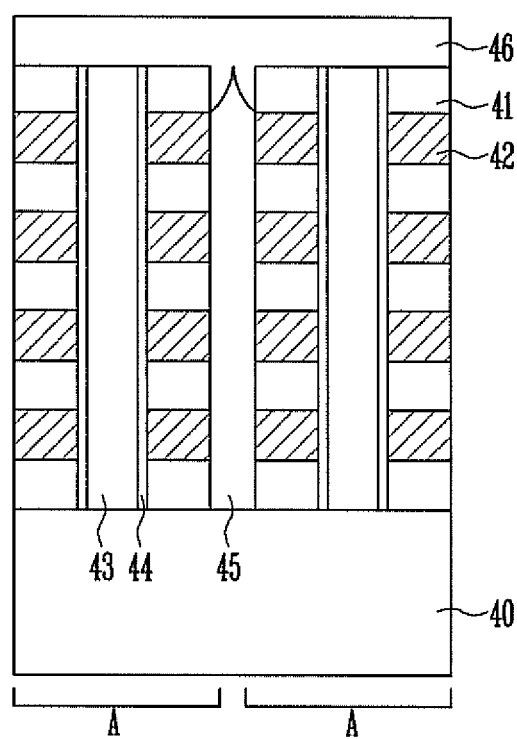
FIG. 4 is a cross-sectional view of a 3-D non-volatile memory device according to a second embodiment of this disclosure.
Figure 5:
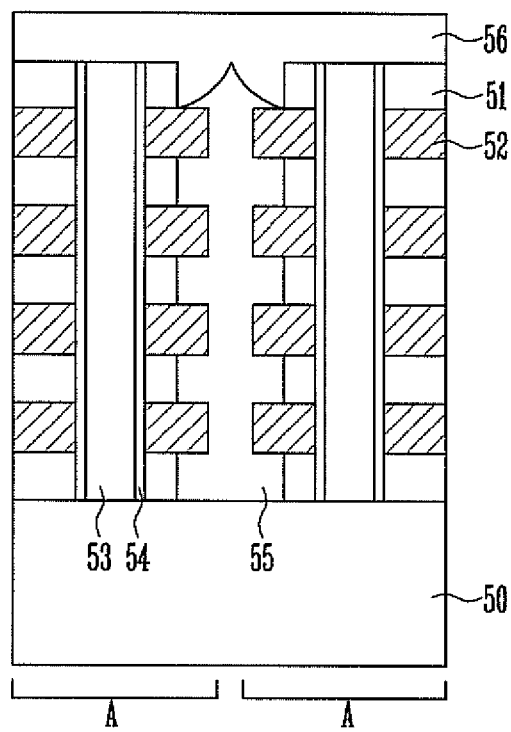
FIG. 5 is a cross-sectional view of a 3-D non-volatile memory device according to a third embodiment of this disclosure.
Figure 6:
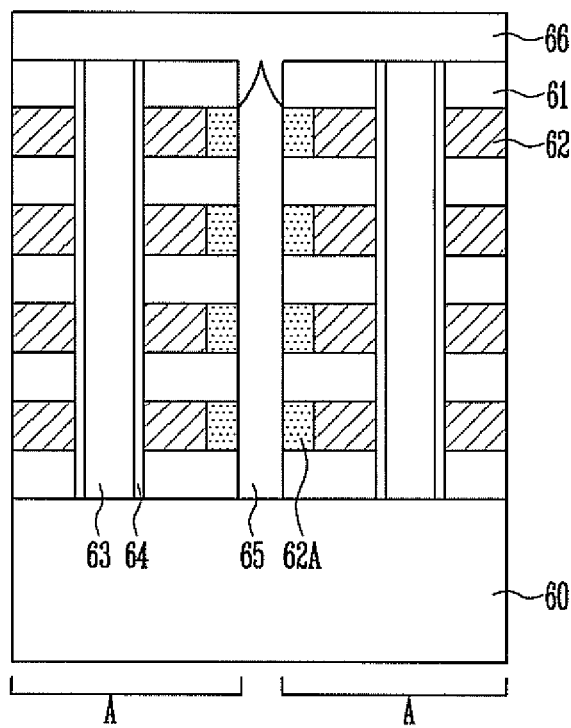
FIG. 6 is a cross-sectional view of a 3-D non-volatile memory device according to a fourth embodiment of this disclosure.

FIGS. 4 to 6 are cross-sectional views of the 3-D non-volatile memory device including an air gap according to second to fourth embodiments of this disclosure. In FIGS. 4-6, only memory cells are shown and select transistors provided over and under the memory cells are not illustrated.

The second to the fourth embodiments describe various structures of air gaps according to exemplary embodiment of this disclosure. The structures other than the air gaps may be the same as those of the memory device according to the first embodiment.

As shown in FIG. 4, an air gap 45 according to the second embodiment is formed between word line structures A. The air gap 45 according to the second embodiment is formed by covering the top of a slit between the word line structures A with an insulating layer 46. As shown in FIG. 4, the interlayer dielectric layers 41 are not recessed before forming the air gap 45.

As shown in FIG. 5, an air gap 55 according to the third embodiment of this disclosure is formed between word line structures A and is configured to include recess regions formed by recessing interlayer dielectric layers 51 to a specific thickness. The air gap 55 according to the third embodiment is formed by forming a slit, extending the slit by etching the interlayer dielectric layers 51 on the sides of the word line structures A closest to the slit to a specific thickness, and then covering the top of the extended slit with an insulating layer 56. Accordingly, the air gap 55 according to the third embodiment is formed to surround the edge regions of word lines 52.

As shown in FIG. 6, an air gap 65 according to the fourth embodiment of this disclosure is formed between word line structures A. The edge regions of word lines 62 are silicided to form silicided edge regions 62A. The air gap 65 according to the fourth embodiment is formed by etchings a slit, siliciding the edge regions 62A of the word lines 62 exposed by the sidewalls of the word line structure A, and then covering the top of the slit with an insulating layer 66.

Figure 7:
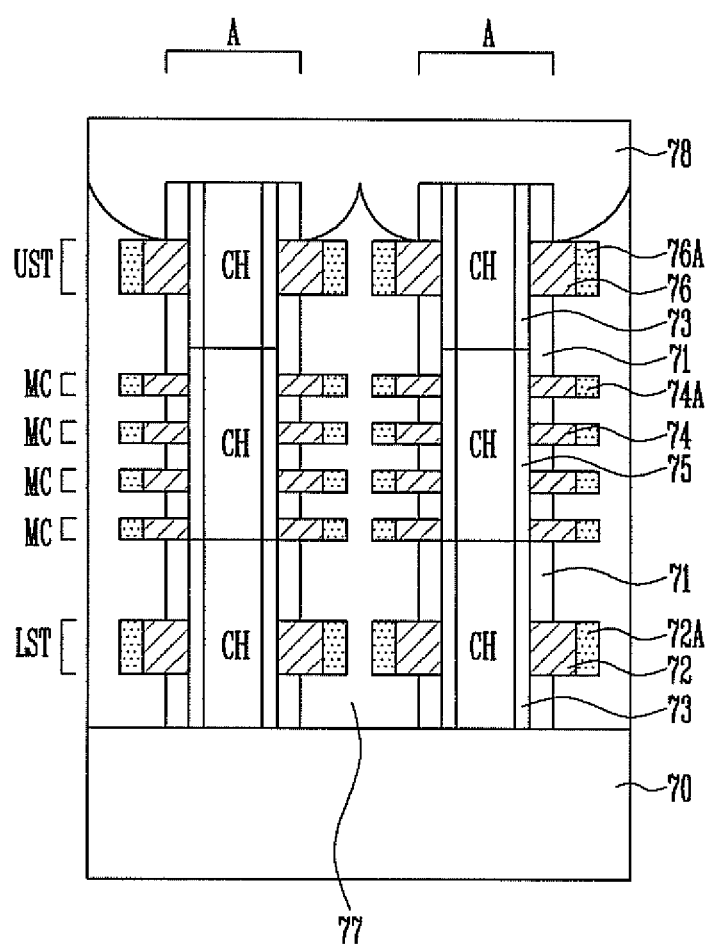
FIG. 7 is a cross-sectional view of a 3-D non-volatile memory device according to a fifth embodiment of this disclosure.

FIG. 7 is a cross-sectional view of a 3-D non-volatile memory device according to a fifth embodiment of this disclosure. The fifth embodiment illustrates an example using the air gap according to the first embodiment.

As shown in FIG. 7, the 3-D non-volatile memory device according to the fifth embodiment of this disclosure includes a plurality of memory cells MC that are stacked along channels CH protruding from a substrate 70. The plurality of memory cells MC is coupled in series between a lower select transistor LST and an upper select transistor UST to form a string. The 3-D non-volatile memory device according to the fifth embodiment of this disclosure includes an air gap 77 between word line structures A and an insulating layer 78 formed on the top of the air gap 77.

The lower select transistor LST and the upper select transistor UST include the channels CH and a gate insulation layer 73 surrounding the channels CH. Edge regions 72A of a lower select line 72 and edge regions 76A of an upper select line 76 may be silicided.

The plurality of memory cells MC includes the channel CH, and a tunnel insulating layer, a charge trap layer, and a charge blocking layer 75 surrounding the channel CH. A method of manufacturing the plurality of memory cells MC is described below in short.

For example, first material layers may be interlayer dielectric layers 71 and second material layers may be word lines 74. In this example, trenches for the channels CH may be formed by etching the interlayer dielectric layers 71 and the word lines 74, which are alternately stacked over the substrate 70. The charge blocking layer, the charge trap layer, and the tunnel insulating layer 75 may be sequentially formed over the inner walls of the trenches. Subsequently, the channels CH are formed within the trenches to form the plurality of memory cells.

For a second example, first material layers may be sacrificial layers, such as undoped polysilicon layers or undoped amorphous silicon layers, and second material layers may be conductive layers for the word lines, such as doped polysilicon layers or doped amorphous silicon layers. For example, the doped polysilicon layers and doped amorphous silicon layers may be doped with impurities, such as boron (B).

In the second example, trenches for the channels CH may be formed by etching the sacrificial layers (not shown) and the conductive layers 74, which are alternately stacked over the substrate 70. A charge blocking layer, a charge trap layer, and a tunnel insulating layer 75 may be sequentially formed on the inner walls of the trenches, and channels are formed within the trenches. A slit may be formed by etching the sacrificial layers and the conductive layers 74 between neighboring channels CH. A plurality of insulation regions may be formed by removing the sacrificial layers exposed by the slit. Subsequently, the plurality of memory cells MC may be formed by burying an interlayer dielectric layer in the insulation regions to separate the stacked conductive layers 74.

For yet another example, first material layers may be the interlayer dielectric layers 71 and second material layers may be sacrificial layers, such as nitride layers. In this example, trenches for the channels CH may be formed by etching the plurality of interlayer dielectric layers 71 and the plurality of sacrificial layers (not shown), which are alternately stacked over the substrate 70, and channels are formed within the trenches. A slit may be formed by etching the plurality of interlayer dielectric layers 71 and the plurality of sacrificial layers between neighboring channels CH. A plurality of word line regions may be formed by removing the plurality of sacrificial layers exposed by the slit. A tunnel insulating layer, a charge trap layer, and the charge blocking layer 75 may be formed along the entire surface of a result in which the plurality of word line regions is formed. Subsequently, the plurality of memory cells MC may be formed by burying a conductive layer, such as a metal layer, in the word line regions to separate the word lines. In this example, unlike in FIG. 7, the tunnel insulating layer, the charge trap layer, and the charge blocking layer 75 are formed to surround the word lines 74.

In FIG. 7, the air gap according to the first embodiment is shown, but the air gaps according to the second to the fourth embodiments may also be used.

Figure 8:
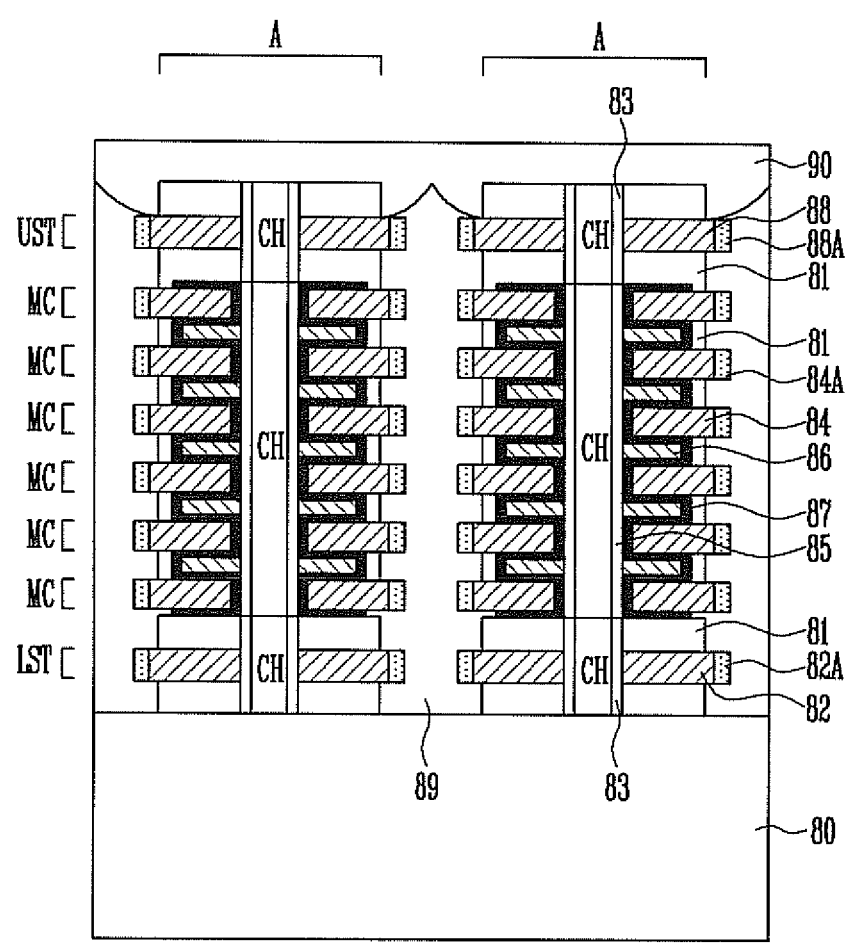
FIG. 8 is a cross-sectional view showing the structure of a 3-D floating gate-type non-volatile memory device according to a sixth embodiment of this disclosure.

FIG. 8 is a cross-sectional view showing the structure of a 3-D floating gate-type non-volatile memory device according to a sixth embodiment of this disclosure. The sixth embodiment illustrates an example using the air gap according to the first embodiment.

As shown in FIG. 8, the 3-D non-volatile memory device according to the sixth embodiment of this disclosure includes a plurality of memory cells MC that are stacked along channels CH protruding from a substrate 80. The plurality of memory cells MC is coupled in series between a lower select transistor LST and an upper select transistor UST to form a string. The 3-D non-volatile memory device according to the sixth embodiment of this disclosure includes an air gap 89 between word line structures A and an insulating layer 90 formed on the top of the air gap 89.

The lower select transistor LST and the upper select transistor UST include the channels CH and a gate insulation layer 83 surrounding the channels CH. Edge regions 82A of a lower select line 82 and edge regions 88A of an upper select line 88 may be silicided.

The plurality of memory cells MC includes the channel CH, a tunnel insulating layer 85 surrounding the channel CH, a floating gate 86 interposed between an interlayer dielectric layer 81 and the tunnel insulating layer 85, and a charge blocking layer 87 interposed between the floating gate 86 and a word line 84.

A method of forming the plurality of memory cells MC according to the preset embodiment is described below in short.

For example, first material layers may be the interlayer dielectric layers 81 and second material layers may be the word lines 84. In this example, trenches for the channels CH may be formed by etching the plurality of interlayer dielectric layers 81 and the word lines 84, which are alternately stacked over the substrate 80. A plurality of floating regions may be formed by recessing the plurality of interlayer dielectric layers 81, exposed by the trenches, to a specific thickness. The charge blocking layer 87 may be formed on the entire surface of the plurality of floating regions. The plurality of floating gates 86 may be formed by burying a conductive layer in the plurality of floating regions over and in between the areas where the charge blocking layer 87 is formed. Subsequently, the tunnel insulating layer 85 may be formed on the inner walls of the trenches. Subsequently, the channels CH are formed in the trenches to form the plurality of memory cells MC.

For another example, first material layers may be sacrificial layers, such as undoped polysilicon layers or undoped amorphous silicon layers, and second material layers may be conductive layers for word lines, such as doped polysilicon layers or doped amorphous silicon layers.

In this example, trenches for the channels CH may be formed by etching the plurality of sacrificial layers (not shown) and the plurality of conductive layers 84, which are alternately stacked over the substrate 80. A plurality of floating regions may be formed by recessing the plurality of interlayer dielectric layers 81, exposed by the trenches, to a specific thickness. The charge blocking layer 87 may be formed on the entire surface of the plurality of floating regions. The plurality of floating gates 86 may be formed by burying a conductive layer in the plurality of floating regions over and in between the areas where the charge blocking layer 87 is formed. Subsequently, after the tunnel insulating layer 85 is formed on the inner walls of the trenches, the channels CH may be formed in the trenches. A slit may be formed by etching the plurality of sacrificial layers and the plurality of conductive layers 84 between neighboring channels CH. A plurality of insulation regions may be formed by removing the plurality of sacrificial layers exposed the slit. Subsequently, the plurality of memory cells MC may be formed by burying an interlayer dielectric layer in the plurality of insulation regions to separate the stacked word lines.

For yet another example, trenches for the channels CH may be formed by etching the plurality of interlayer dielectric layers 81 and the plurality of sacrificial layer (not shown), which are alternately stacked over the substrate 80. A plurality of floating regions may be formed by recessing the plurality of interlayer dielectric layers 81, exposed by the trenches, to a specific thickness. The charge blocking layer 87 may be formed on the entire surface of the plurality of floating regions. The plurality of floating gates 86 may be formed by burying a conductive layer in the plurality of floating regions over and in between the areas where the charge blocking layer 87 is formed. Subsequently, after the tunnel insulating layer 85 is formed on the inner walls of the trenches, the channels CH may be formed in the trenches. A slit may be formed by etching the plurality of interlayer dielectric layers 81 and the plurality of sacrificial layers between neighboring channels CH. A plurality of word line regions may be formed by removing the plurality of sacrificial layers exposed by the slit. The plurality of memory cells MC may be formed by burying a conductive layer in the plurality of word line regions to separate the word lines 84.

In FIG. 8, the air gap according to the first embodiment is shown, but the air gaps according to the second to the fourth embodiments may also be used.

Figure 9:
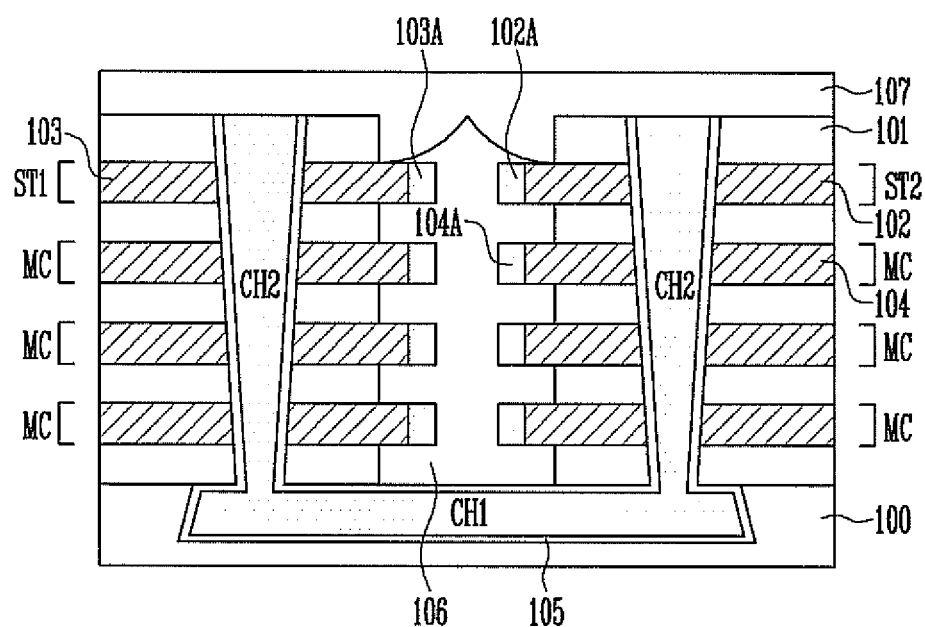
FIG. 9 is a cross-sectional view showing the structure of a 3-D U-shaped channel-type non-volatile memory device according to a seventh embodiment of this disclosure.

FIG. 9 is a cross-sectional view showing the structure of a 3-D U-shaped channel-type non-volatile memory device according to a seventh embodiment of this disclosure. The seventh embodiment illustrates an example using the air gap according to the first embodiment.

As shown in FIG. 9, the 3-D non-volatile memory device according to the present embodiment includes a plurality of memory cells MC stacked along a U-shaped channel. The U-shaped channel includes a first channel CH1 buried in a pipe gate 100 and two or more second channels CH2 coupled to the first channel CH1. The plurality of memory cells MC is arranged in a U shape between a first select transistor ST1 and a second select transistor ST2 formed over the memory cells MC. The plurality of memory cells MC and the first select transistor ST1 and the second select transistor ST2 form one string. An air gap 106 is formed between the two second channels CH2. An insulating layer 107 is formed on the top of the air gap 106. In some embodiments, the air gap may be formed between neighboring U-shaped channels, or the air gap may be formed between the second channels CH2 within the U-shaped channels and between neighboring U-shaped channels.

The U-shaped channel includes the first select transistor ST1, the second select transistor ST2, and the plurality of memory cells MC. A tunnel insulating layer, a charge trap layer, and a charge blocking layer 105 may be formed to surround the U-shaped channel. The tunnel insulating layer, the charge trap layer, and the charge blocking layer 105 formed in the channel regions of the first select transistor ST1 and the second select transistor ST2 may be gate insulation layers. In some embodiments, the gate insulation layer formed in the channel regions of the first select transistor ST1 and the second select transistor ST2 may be an oxide layer.

The edge region 103A of a first select line 103, the edge region 102A of a second select line 102, and the edge regions 104A of word lines 104 may be silicided.

A method of forming the plurality of memory cells MC and the first and the second select transistors ST1 and ST2 according to the seventh embodiment of this disclosure is described below.

First, after an interlayer dielectric layer (not shown) is formed over a substrate (not shown), a pipe gate 100 is formed on the interlayer dielectric layer. A first trench is formed by etching the pipe gate 100. A first sacrificial layer (not shown), such as a nitride layer, is buried in the first trench. A plurality of first material layers 101 and a plurality of second material layers 104 are alternately formed over the pipe gate 100 where the first sacrificial layer is buried. The first and the second material layers 101 and 104 are etched to form two second trenches coupled to the first trench. A second sacrificial layer (not shown) is formed in the second trenches.

Subsequently, the interlayer dielectric layers 101 and the first and the second select lines 103 and 102 are formed over the resulting surface. A trench for a U-shaped channel is formed by removing the second sacrificial layer and the first sacrificial layer. Subsequently, the charge blocking layer, the charge trap layer, and the tunnel insulating layer 105 are sequentially formed over the inner wall of the trench for the U-shaped channel, thereby forming the channels CH1 and CH2.

Subsequently, a slit may be formed by etching the first material layers 101 and the second material layers 104. The first material layer 101 or the second material layer 104 is recessed, and interlayer dielectric layers or the word lines are formed. Accordingly, the plurality of memory cells MC, the first select transistor ST1, and the second select transistor ST2 are formed.

In the present embodiment, an example has been described in which the channels CH1 and CH2 are formed by fully burying a layer for the channels in the trenches for the U-shaped channel. However, the channels CH1 and CH2 may be formed so that a central region is opened along the inner face of the trench for the U-shaped channel, and the opened central region may be filled with an insulating layer.

Furthermore, in FIG. 9, the air gap according to the first embodiment is shown, but the air gaps according to the second embodiment to fourth embodiments may also be used. Furthermore, in FIG. 9, the charge trap-type non-volatile memory device is shown, but a U-shaped channel-type non-volatile memory device having floating gates, like the embodiment shown in FIG. 8, may also be manufactured.

The present disclosure provides the 3-D non-volatile memory device including the air gap between neighboring word lines. Accordingly, RC delay in the memory device can be decreased because capacitance between neighboring word lines is reduced. Furthermore, since the thickness of an interlayer dielectric layer is reduced, the memory devices may be highly integrated.

What is claimed is:

1. A method of manufacturing a three-dimensional (3-D) non-volatile memory device, the method comprising:
    forming a plurality of memory cells stacked along channels protruded from a substrate, wherein the channels penetrate a plurality of first material layers and a plurality of second material layers that are alternately stacked over the substrate;
    forming a plurality of word line structures extended in parallel;
    forming a slit between the plurality of word line structures by etching the plurality of first material layers and the plurality of second material layers between neighboring channels; and
    forming an air gap between the plurality of word line structures by forming an insulating layer to cover a top of the slit,
    wherein forming a plurality of memory cells comprises:
        forming the plurality of first material layers and the plurality of second material layers alternately over the substrate;
        forming trenches for the channels by etching the plurality of first material layers and the plurality of second material layers; and
        forming the channels in the trenches.

2. The method of claim 1, further comprising siliciding edge regions of the plurality of word lines, exposed by sidewalls of the word line structures, after forming the slit.

3. The method of claim 1, further comprising recessing the plurality of first material layers, exposed by sidewalls of the word line structures, after forming the slit.

4. The method of claim 3, wherein recessing the plurality of first material layers is performed using a remote plasma process or a wet etch process.

5. The method of claim 1, further comprising forming a charge blocking layer, a charge trap layer, and a tunnel insulating layer over inner walls of the trenches, after forming the trenches.

6. The method of claim 1, further comprising:
    forming a plurality of recess regions by removing the plurality of second material layers exposed by the slit, after forming the slit and
    forming interlayer dielectric layers or word lines in the plurality of recess regions.

7. The method of claim 6, wherein the second material layer is a sacrificial layer.

8. The method of claim 6, further comprising forming a tunnel insulating layer, a charge trap layer, and a charge blocking layer, after forming the trenches for the channels or forming the plurality of recess regions.

9. A method of manufacturing a three-dimensional (3-D) non-volatile memory device, the method comprising:
    forming a plurality of memory cells stacked along channels protruded from a substrate, wherein the channels penetrate a plurality of first material layers and a plurality of second material layers that are alternately stacked over the substrate;
    forming a plurality of word line structures extended in parallel;
    forming a slit between the plurality of word line structures by etching the plurality of first material layers and the plurality of second material layers between neighboring channels; and
    forming an air gap between the plurality of word line structures by forming an insulating layer to cover a top of the slit,
    wherein forming a plurality of memory cells comprises:
        forming the plurality of first material layers and the plurality of second material layers alternately over the substrate;
        forming trenches for the channels by etching the plurality of first material layers and the plurality of second material layers;
        forming a plurality of floating regions by recessing the plurality of first material layers, exposed by inner walls of the trenches;
        forming a charge blocking layer on an entire surface of the floating regions;
        faulting a plurality of floating gates by burying a conductive layer in the plurality of floating regions on the charge blocking layer;
        forming a tunnel insulating layer on the inner walls of the trenches; and
        forming the channels in the trenches in which the tunnel insulating layer is formed.

10. The method of claim 9, further comprising:
forming a plurality of recess regions by removing the plurality of second material layers exposed by the slit, after forming the slit and
forming interlayer dielectric layers or word lines in the plurality of recess regions.

11. The method of claim 10, wherein the second material layer is a sacrificial layer.

12. A method of manufacturing a three-dimensional (3-D) non-volatile memory device, the method comprising:
forming a plurality of memory cells stacked along channels protruded from a substrate, wherein the channels penetrate a plurality of first material layers and a plurality of second material layers that are alternately stacked over the substrate;
forming a plurality of word line structures extended in parallel;
forming a slit between the plurality of word line structures by etching the plurality of first material layers and the plurality of second material layers between neighboring channels; and
forming an air gap between the plurality of word line structures by forming an insulating layer to cover a top of the slit,
wherein forming a plurality of memory cells comprises:
forming trenches for U-shaped channels, including a first trench, formed by etching a pipe gate, and at least two second trenches coupled to the first trench and configured to penetrate the plurality of first material layers and the plurality of second material layers;
forming a charge blocking layer, a charge trap layer, and a tunnel insulating layer over inner walls of the trenches; and
forming the U-shaped channels in the trenches.

13. The method of claim 12, wherein forming a slit comprises etching the plurality of first material layers and the plurality of second material layers between neighboring U-shaped channels, etching the plurality of first material layers and the plurality of second material layers between the second channels included in each of the U-shaped channels, or etching the plurality of first material layers and the plurality of second material layers between neighboring U-shaped channels and between the second channels included in each of the U-shaped channels.

* * * * *